(12) United States Patent
Choi et al.

(10) Patent No.: US 7,835,199 B2
(45) Date of Patent: Nov. 16, 2010

(54) NONVOLATILE MEMORY USING RESISTANCE MATERIAL

(75) Inventors: Joon-Yong Choi, Seoul (KR);
Byung-Gil Choi, Yongin-si (KR);
Du-Eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 93 days.

(21) Appl. No.: 12/244,042

(22) Filed: Oct. 2, 2008

(65) Prior Publication Data

US 2009/0097304 A1   Apr. 16, 2009

(30) Foreign Application Priority Data

Oct. 11, 2007   (KR) .................. 10-2007-0102659

(51) Int. Cl.
*G11C 5/14* (2006.01)
*G11C 8/00* (2006.01)
(52) U.S. Cl. .............. 365/189.09; 365/227; 365/230.06
(58) Field of Classification Search ............. 365/189.09
See application file for complete search history.

(56) References Cited

U.S. PATENT DOCUMENTS

| 5,051,959 | A | * | 9/1991 | Nakano et al. | ......... 365/230.06 |
|---|---|---|---|---|---|
| 5,416,747 | A | * | 5/1995 | Ohira | ..................... 365/230.06 |
| 5,602,784 | A | * | 2/1997 | Kojima et al. | .......... 365/189.09 |
| 5,761,148 | A | * | 6/1998 | Allan et al. | ............. 365/230.06 |
| 6,128,230 | A | * | 10/2000 | Amanai | ................. 365/185.23 |
| 6,262,926 | B1 | * | 7/2001 | Nakai | .......................... 365/200 |
| 6,337,831 | B1 | * | 1/2002 | Nam | .................... 365/230.06 |
| 6,449,192 | B2 | * | 9/2002 | Otsuka | ................... 365/185.23 |
| 6,522,171 | B2 | * | 2/2003 | Hanson et al. | ................. 326/95 |
| 6,587,375 | B2 | * | 7/2003 | Chung et al. | ........... 365/185.13 |
| 6,822,921 | B2 | * | 11/2004 | Otsuka | ........................ 365/226 |
| 7,313,050 | B2 | * | 12/2007 | Lee et al. | ............... 365/230.06 |
| 2005/0201186 | A1 | * | 9/2005 | Yamazaki et al. | ....... 365/230.06 |
| 2007/0008807 | A1 | * | 1/2007 | Jeong | ..................... 365/230.06 |
| 2007/0030738 | A1 | * | 2/2007 | Oh | ......................... 365/189.01 |
| 2008/0089121 | A1 | * | 4/2008 | Aochi et al. | ................. 365/163 |

FOREIGN PATENT DOCUMENTS

| KR | 1020060117019 A | 11/2006 |
|---|---|---|
| KR | 100674997 B1 | 1/2007 |
| KR | 1020070008216 A | 1/2007 |

* cited by examiner

*Primary Examiner*—Son L Mai
(74) *Attorney, Agent, or Firm*—Volentine & Whitt, PLLC

(57) ABSTRACT

Provided is a nonvolatile memory using a resistance material. In embodiments of the invention, a PRAM is configured to apply a step-down voltage to wordlines during a standby mode. Aspects of the present invention thus provide a nonvolatile memory with reduced standby current. Additionally, embodiments of the invention allow for faster transition from a standby state to an active state.

16 Claims, 10 Drawing Sheets

WRITE OPERATION

READ OPERATION

STANDBY OPERATION

VPPX > VCC > VR

US 7,835,199 B2

NONVOLATILE MEMORY USING RESISTANCE MATERIAL

CROSS-REFERENCE TO RELATED APPLICATIONS

This application claims priority from Korean Patent Application No. 10-2007-0102659 filed on Oct. 11, 2007, the subject matter of which is hereby incorporated by reference.

BACKGROUND OF THE INVENTION

1. Field of the Invention

The present invention relates generally to nonvolatile memory devices using a resistance material, and more particularly, but not by way of limitation, to a phase-change random access memory (PRAM) that is configured to apply a step-down voltage to wordlines during a standby mode.

2. Description of the Related Art

Nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM becomes a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

A phase-change memory cell includes a variable resistance device made of a phase-change material and an access device controlling current that flows through the variable resistance device. The access device may be a transistor or a diode. A phase-change memory cell using a transistor as the access device is referred to as a transistor-controlled PRAM cell, and a phase-change memory cell using a diode as the access device is referred to as a diode-controlled PRAM cell.

Known PRAMs have many disadvantages, however. For instance, a standby current in PRAMs are larger than desired. Improved PRAM devices and other nonvolatile memories that use resistive materials are therefore needed.

SUMMARY OF THE INVENTION

In embodiments of the invention, a PRAM is configured to apply a step-down voltage to wordlines during a standby mode. Aspects of the present invention thus provide a nonvolatile memory with reduced standby current.

According to an aspect of the present invention, there is provided a nonvolatile memory. The nonvolatile memory includes: a memory cell array having a plurality of nonvolatile memory cells arranged in a plurality of rows and a plurality of columns; a plurality of wordlines, each of the plurality of wordlines coupled to a corresponding one of the plurality of rows; a plurality of bitlines, each of the plurality of bitlines coupled to a corresponding one of the plurality of columns; and a row decoder coupled to the plurality of wordlines and configured to supply a step-down voltage to the plurality of wordlines during a standby period, the step-down voltage being lower in magnitude than a power supply voltage.

According to another aspect of the present invention, there is provided a nonvolatile memory. The non-volatile memory includes: a plurality of memory blocks, each comprising a plurality of nonvolatile memory cells; a main wordline common to the plurality of memory blocks; a plurality of sub wordlines, each of the plurality of sub wordlines corresponding to one of the plurality of memory blocks; a main decoder coupled to the main wordline; a plurality of sub decoders, each of the plurality of sub decoders coupled between the main wordline and a corresponding one of the plurality of sub wordlines; a first voltage switch coupled to the main decoder and configured to selectively supply one of at least two voltages to the main decoder; and a second voltage switch coupled to the plurality of sub decoders and configured to selectively supply one of at least two voltages to the sub decoders.

The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
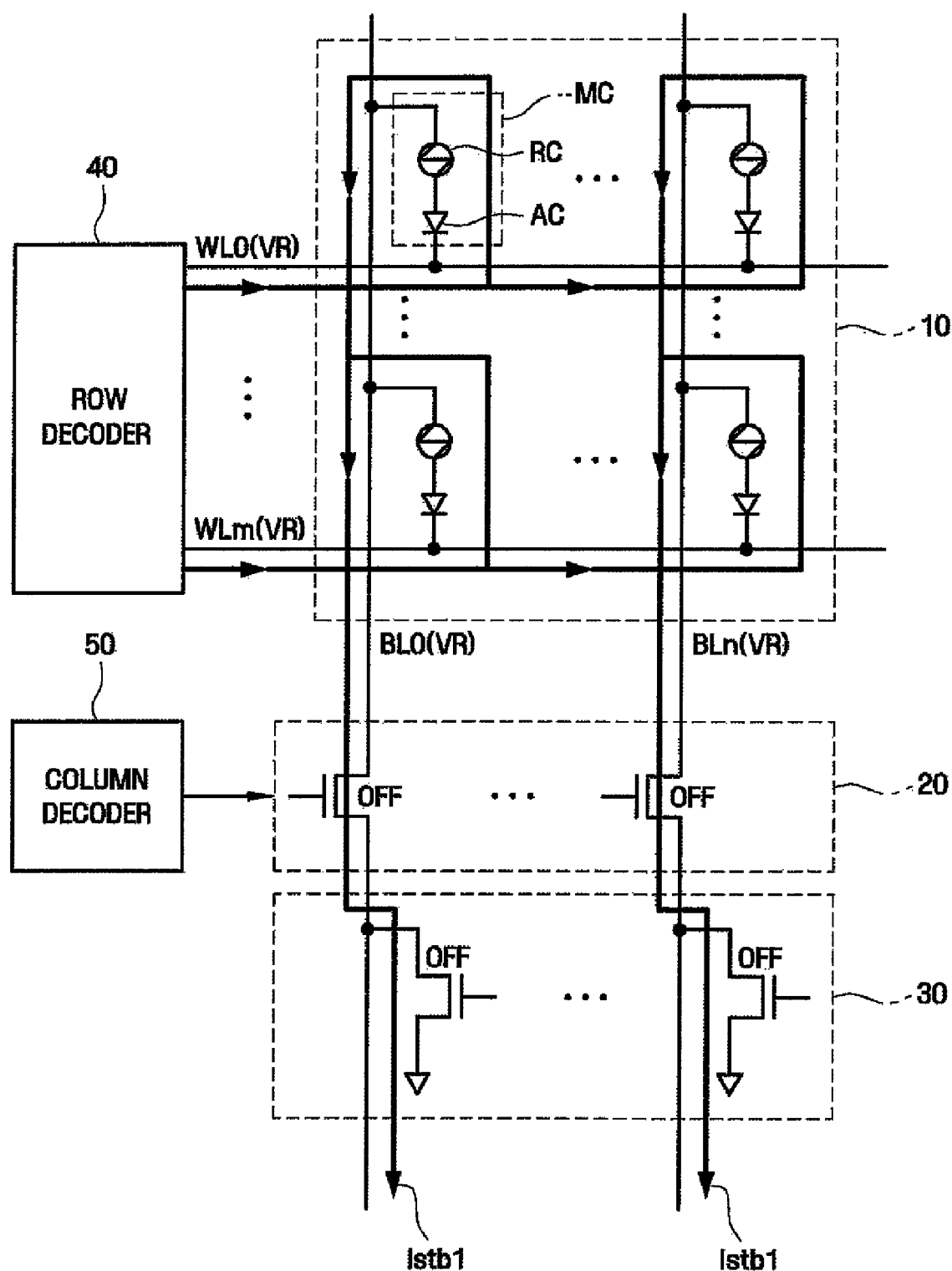
FIG. 1 is a block diagram of a nonvolatile memory according to a first embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components, and/or sections, these elements, components, and/or sections should not be limited by these terms. These terms are only used to distinguish one element, component or section from another region, layer or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described using a phase-change random access memory (PRAM). However, it is obvious to those of ordinary skill in the art to which the present invention pertains that the present invention can be applied to all nonvolatile memories using resistance materials, such as resistive RAMs and ferroelectric RAMs.

Figure 2:
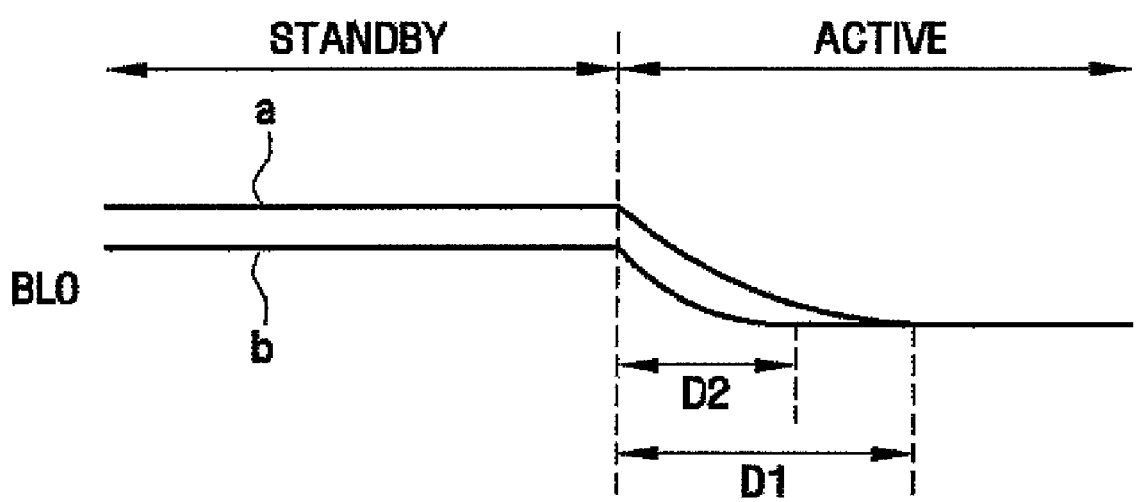
FIG. 2 is a timing diagram for explaining the operation of the nonvolatile memory according to the first embodiment of the present invention.

FIG. 1 is a block diagram of a nonvolatile memory according to a first embodiment of the present invention. FIG. 2 is a timing diagram for explaining the operation of the nonvolatile memory according to the first embodiment of the present invention.

Referring to FIG. 1, the nonvolatile memory according to the first embodiment of the present invention includes a memory cell array 10, a plurality of wordlines WL0 through WLm, a plurality of bitlines BL0 through BLn, a column selection block 20, a discharge block 30, a row decoder 40, and a column decoder 50.

The memory cell array 10 includes rows and columns of nonvolatile memory cells MC. The rows of the nonvolatile memory cells MC are coupled to the wordlines WL0 through WLm, respectively, and the columns of the nonvolatile memory cells MC are coupled to the bitlines BL0 through BLn, respectively.

In addition, each of the nonvolatile memory cells MC may include a variable resistance device RC and an access device AC. The variable resistance device RC includes a phase-change material having different resistance values in a crystalline state and an amorphous state. The access device AC controls current flowing through the variable resistance device RC. The access device AC may be a diode or a transistor coupled in series with the variable resistance device RC. The variable access device AC illustrated in FIG. 1 is a diode. However, the present invention is not limited thereto. A phase-change memory cell using a diode as the access device AC is referred to as a diode-controlled PRAM cell. Various types of materials may be used as the phase-change material. For example, the phase-change material may be a combination of two elements, such as GaSb, InSb, InSe, Sb2Te3 or GeTe, a combination of three elements, such as GeSbTe, GaSeTe, InSbTe, SnSb2Te4 or InSbGe, or a combination of four elements such as AgInSbTe, (GeSn)SbTe, GeSb(SeTe) or Te81Ge15Sb2S2. In particular, GeSbTe, which is a combination of germanium (Ge), antimony (Sb) and tellurium (Te), may be typically used as the phase-change material.

The column selection block 20 may be placed on one side and/or both sides of the memory cell array 10. For the clarity of description, the column selection block 20 is placed on one side of (for example, under) the memory cell array 10 in FIG. 1. However, the present invention is not limited thereto. The column selection block 20 may include a plurality of column selection transistors coupled to the bitlines BL0 through BLn, respectively.

The discharge block 30 may be placed on one side and/or both sides of the memory cell array 10. For the clarity of description, the discharge block 30 is placed on one side of (for example, under) the memory cell array 10 in FIG. 1. However, the present invention is not limited thereto. The discharge block 30 may include a plurality of discharge transistors coupled to the bitlines BL0 through BLn, respectively.

The row decoder 40 selects at least one of the wordlines WL0 through WLm by controlling voltage levels of the wordlines WL0 through WLm. The column decoder 50 selects at least one of the bitlines BL0 through BLn.

The nonvolatile memory according to the first embodiment of the present invention can reduce standby current. The standby current denotes current that is consumed by a nonvolatile memory during a standby period. Specifically, in order to minimize the standby current, the bitlines BL0 through BLn may be floated during the standby period. However, even if the bitlines BL0 through BLn are floated, their voltage levels may become equal to those of the wordlines WL0 through WLm over time due to reverse current of the access devices AC (that is, diodes) of the nonvolatile memory cells MC.

Therefore, if the voltage levels of the wordlines WL0 through WLm are high during the standby period, those of the bitlines BL0 through BLn may also be high. If the voltage levels of the bitlines BL0 through BLn become high during the standby period, a drain-source voltage VDS of each discharge transistor within the discharge block 30 may also become high. Consequently, the standby current leaked from the discharge transistors may be increased. In addition, the time required to discharge the bitlines BL0 through BLn when an operation state of the nonvolatile memory changes from a standby state to an active state may be increased. That is, when the state of the nonvolatile memory changes from the standby state to the active state, the bitlines BL0 through BLn must be discharged to, for example, a level of a ground voltage. However, if the voltage levels of the charged bitlines BL0 through BLn are high, it may take a long time to discharge the bitlines BL0 through BLn to the level of the ground voltage.

In this regard, in the first embodiment of the present invention, a step-down voltage VR lower than the ground voltage may be supplied to the wordlines WL0 through WLm during the standby period.

In the first embodiment of the present invention, since the step-down voltage VR is supplied to the wordlines WL0 through WLm during the standby period, the voltage levels of the bitlines BL0 through BLn become equal to the level of the step-down voltage VR. Then, since the voltage levels of the bitlines BL0 through BLn are low, standby current Istb1 leaked from the discharge transistors within the discharge block 30 is reduced.

In addition, when the operation state of the nonvolatile memory changes from the standby state to the active state, the time required to discharge the bitlines BL0 through BLn to, for example, the level of the ground voltage is reduced. Specifically, referring to FIG. 2, reference character "a" indicates a case where the bitline BL0 is charged to a voltage level equal to or higher than a level of a power supply voltage VCC, and reference character "b" indicates a case where the bitline BL0 is charged to the level of the step-down voltage VR. It can be understood from FIG. 2 that the time D2 required to discharge the bitline BL0 from the level of the step-down voltage VR to the level of the ground voltage is shorter than the time D1 required to discharge the bitline BL0 from the level of the power supply voltage VCC to the level of the ground voltage.

Figure 3:
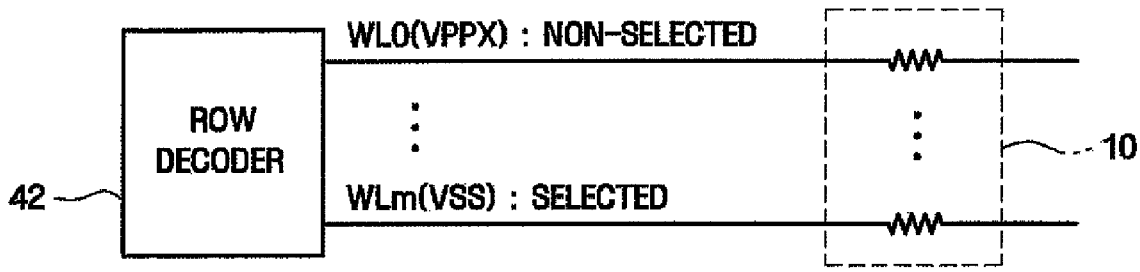
FIG. 3 is a conceptual diagram for explaining a nonvolatile memory according to a second embodiment of the present invention.
Figure 3:
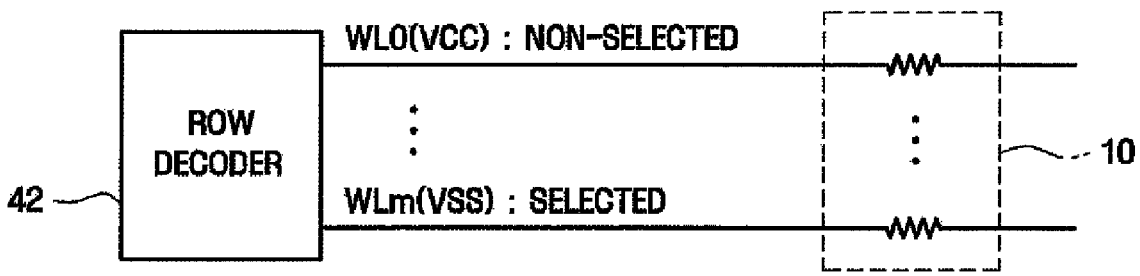
Figure 3:
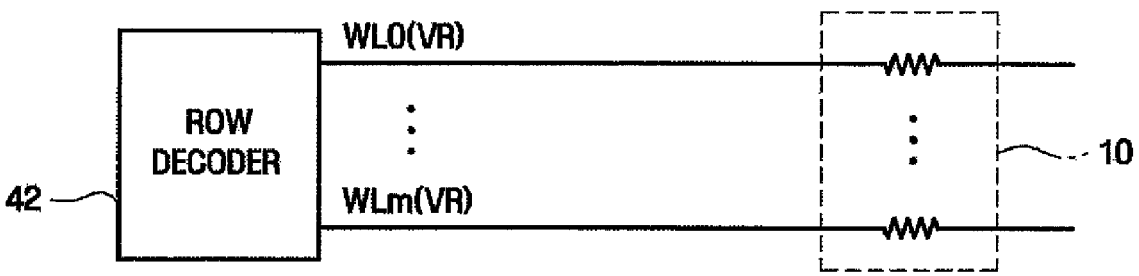

FIG. 3 is a conceptual diagram for explaining a nonvolatile memory according to a second embodiment of the present invention.

Referring to FIG. 3, in the second embodiment of the present invention, a row decoder 42 may control voltage levels of wordlines WL0 through WLm according to an operation mode of the nonvolatile memory.

Specifically, during a write period, the row decoder 42 may supply a first step-up voltage VPPX to at least one (for example, the wordline WL0) of the wordlines WL0 through WLm and supply a ground voltage VSS to another one (for example, the wordline WLm) of the wordlines WL0 through WLm. In this case, the wordline WLm to which the ground voltage VSS is supplied, may be a wordline (that is, a selected wordline) coupled to a nonvolatile memory cell that is to be written, and the wordline WL0 to which the first step-up voltage VPPX is supplied may be an unselected wordline.

During a read period, the row decoder 42 may supply a power supply voltage VCC to at least one (for example, the wordline WL0) of the wordlines WL0 through WLm and supply the ground voltage VSS to another one (for example, the wordline WLm) of the wordlines WL0 through WLm. In this case, the wordline WLm to which the ground voltage VSS is supplied, may be a wordline (that is, a selected wordline) coupled to a nonvolatile memory cell that is to be read, and the wordline WL0 to which the power supply voltage VCC is supplied may be an unselected wordline.

During a standby period, the row decoder 42 supplies a step-down voltage VR to the wordlines WL0 through WLm.

Here, the first step-up voltage VPPX is higher than the power supply voltage VCC, and the step-down voltage VR is lower than the power supply voltage VCC. For example, the first step-up voltage may be approximately 4 V, the power supply voltage VCC may be approximately 1.8 V, and the step-down voltage VR may be approximately 0.8 V to 1.4 V.

As described above, since the step-down voltage VR is supplied to the wordlines WL0 through WLm during the standby period, the standby current can be reduced. In addition, the time required to discharge the bitlines BL0 through BLn when an operation state of the nonvolatile memory changes from the standby state to the active state can be reduced.

In FIG. 3, the row decoder 42 controls the voltage levels of the wordlines WL0 through WLm according to the write period, the read period or the standby period. However, the present invention is not limited thereto. That is, the row decoder 42 may control the voltage levels of the wordlines WL0 through WLm according to three different periods.

In addition, the first step-up voltage VPPX, the power supply voltage VCC, and the step-down voltage VR are used in FIG. 3. However, the present invention is not limited thereto. That is, the row decoder 42 may supply a first voltage to at least one (for example, the wordline WL0) of the wordlines WL0 through WLm during the write period, supply a second voltage, which is lower than the first voltage, to at least one of (for example, the wordline WL0) of the wordlines WL0 through WLm during the read period, and supply a third voltage, which is lower than the second voltage, to the wordlines WL0 through WLm during the standby period.

Figure 4:
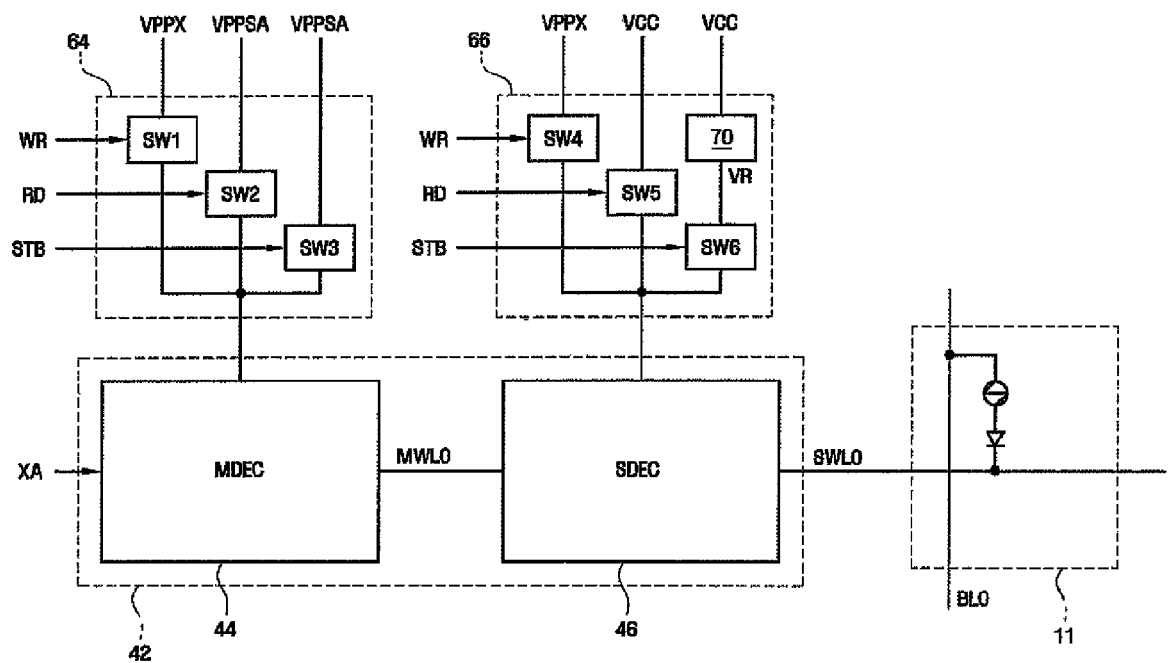
FIG. 4 is a block diagram of the nonvolatile memory according to the second embodiment of the present invention.
Figure 5:
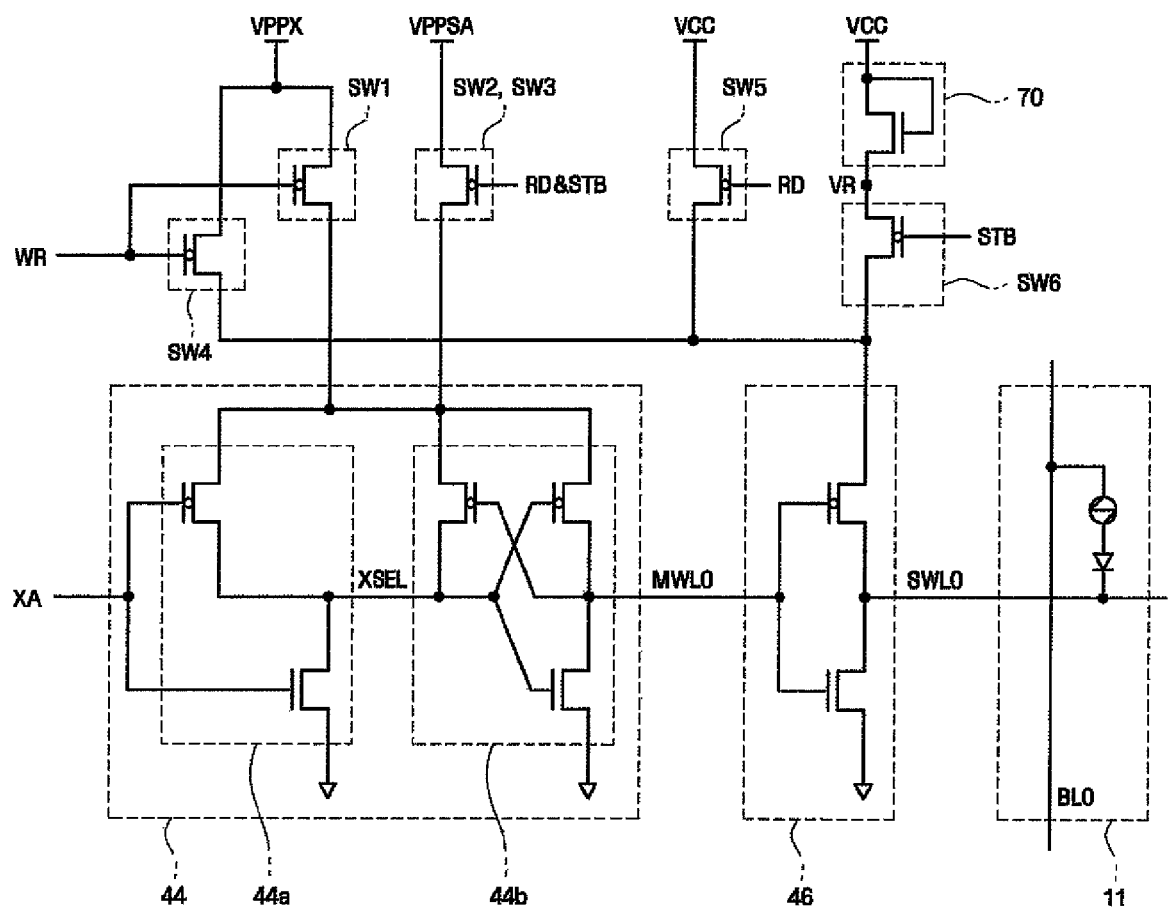
FIG. 5 is a circuit diagram of the nonvolatile memory according to the second embodiment of the present invention.

FIG. 4 is a block diagram of the nonvolatile memory according to the second embodiment of the present invention. FIG. 5 is a circuit diagram of the nonvolatile memory according to the second embodiment of the present invention. That is, FIG. 4 is an exemplary block version of the conceptual diagram of FIG. 3. FIG. 5 is an exemplary circuit version of the block diagram of FIG. 4.

As nonvolatile memories have greater capacity and become more highly integrated, they may be implemented in a hierarchical wordline structure using a main wordline and a plurality of sub wordlines. The nonvolatile memory shown in FIGS. 4 and 5 is implemented based on the hierarchical wordline structure. In addition, a memory cell array may include a plurality of memory blocks. The main wordline may be common to the memory blocks, and each of the sub wordlines may correspond to each of the memory blocks, respectively. For the simplicity of description, a main wordline MWL0, a sub wordline SWL0, and a memory block 11 are illustrated in FIGS. 4 and 5.

Referring to FIGS. 4 and 5, the row decoder 42 includes a main decoder 44 coupled to the main wordline MWL0 and a sub decoder 46 coupled between the main wordline MWL0 and the sub wordline SWL0. Specifically, the main decoder 44 includes an input unit 44a and a latch unit 44b as illustrated in FIG. 5. The input unit 44a receives a row address XA and provides an address signal XSEL. The latch unit 44b latches the address signal XSEL and outputs the latched address signal XSEL to the main wordline MWL0.

In addition, a first voltage switch 64 is coupled to the main decoder 44, and a second voltage switch 66 is coupled to the sub decoder 46.

The first voltage switch 64 may selectively apply one of at least two voltages to the main decoder 44. In FIGS. 4 and 5, the first voltage switch 64 may supply a first step-up voltage VPPX or a second step-up voltage VPPSA according to an operation mode of the nonvolatile memory. As shown in the drawings, the first step-up voltage VPPX or the second step-up voltage VPPSA may be supplied to the input unit 44a and/or the latch unit 44b within the main decoder 44. The first step-up voltage VPPX may be supplied during a write operation, and the second step-up voltage VPPSA may be supplied during a read operation and a standby operation. In this case, the first step-up voltage VPPX may be higher than the second step-up voltage VPPSA. For example, the first step-up voltage VPPX may be approximately 4 V, and the second step-up voltage VPPSA may be approximately 3 V.

Specifically, the first voltage switch 64 includes first through third switching units SW1 through SW3. The first switching unit SW1 applies the first step-up voltage VPPX to the main decoder 44 in response to a write signal WR. The second switching unit SW2 applies the second step-up voltage VPPSA to the main decoder 44 in response to a read signal RD. The third switching unit SW3 applies the second step-up voltage VPPSA to the main decoder 44 in response to a standby signal STB.

As illustrated in FIG. 5, the first switching unit SW1 may be implemented as a p-channel metal oxide semiconductor (PMOS) transistor having a gate to which the write signal WR is input. The second and third switching units SW2 and SW3 may be implemented as a PMOS transistor having a gate to which a signal RD&STB generated using the read signal RD and the standby signal STB is input. Alternatively, the second and third switching units SW2 and SW3 may be implemented as separate PMOS transistors. That is, the second switching unit SW2 may be implemented as a PMOS transistor having a gate to which the read signal RD is input, and the third switching unit SW3 may be implemented as a PMOS transistor having a gate to which the standby signal STB is input.

The second voltage switch 66 may selectively apply one of at least two voltages to the sub decoder 46. In FIGS. 4 and 5, the second voltage switch 66 may supply the first step-up voltage VPPX, the power supply voltage VCC or the step-down voltage VR according to the operation mode of the nonvolatile memory. The second voltage switch 66 may supply the first step-up voltage VPPX during the write operation, supply the power supply voltage VCC during the read operation, and supply the step-down voltage VR during the standby operation.

Specifically, the second voltage switch 66 includes fourth through sixth switching units SW4 through SW6 and a step-down unit 70. The fourth switching unit SW4 applies the first step-up voltage VPPX to the sub decoder 46 in response to the write signal WR. The fifth switching unit SW5 applies the power supply voltage VCC to the sub decoder 46 in response to the read signal RD. The step-down unit 70 receives and steps down the power supply voltage VCC and generates the step-down voltage VR. The sixth switching unit SW6 applies the step-down voltage VR to the sub decoder 46 in response to the standby signal STB.

Referring to FIG. 5, the fourth switching unit SW4 may be implemented as a PMOS transistor having a gate to which the write signal WR is input. The fifth switching unit SW may be implemented as a PMOS transistor having a gate to which the read signal RD is input. The sixth switching unit SW6 may be implemented as a PMOS transistor having a gate to which the standby signal STB is input.

The step-down unit 70 may be a diode-connected n-channel metal oxide semiconductor (NMOS) transistor. The step-down unit 70 may be implemented in various ways and is not limited to the diode-connected NMOS transistor. If the step-down unit 70 is implemented as a diode-connected NMOS transistor, the step-down voltage VR may be VCC-Vth (where Vth indicates a threshold voltage of an NMOS transistor). For example, if the power supply voltage VCC is approximately 1.8 V and the threshold voltage Vth is approximately 0.6 V, the step-down voltage VR is approximately 1.2 V.

The operation of the nonvolatile memory will now be described. Here, it is assumed that the row address XA is an address (for example, logic low) corresponding to an unselected wordline.

During the write period, the main decoder 44 and the sub decoder 46 receive the first step-up voltage VPPX. Since the row address XA corresponds to an unselected wordline, the row address XA is logic low. The input unit 44a generates a logic high address signal XSEL using the first step-up voltage VPPX. The latch unit 44b supplies the ground voltage to the main wordline MWL0. Accordingly, the sub decoder 46 supplies the first step-up voltage VPPX to the sub wordline SWL0.

During the read period, the main decoder 44 and the sub decoder 46 receive the second step-up voltage VPPSA and the power supply voltage VCC, respectively. The row address XA is logic low, and the input unit 44a generates a logic high address signal XSEL using the second step-up voltage VPPSA. The latch unit 44b supplies the ground voltage to the main wordline MWL0. Accordingly, the sub decoder 46 supplies the power supply voltage VCC to the sub wordline SWL0.

During the standby period, the main decoder 44 and the sub decoder 46 receive the second step-up voltage VPPSA and the step-down voltage VR, respectively. The row address XA is logic low, and the input unit 44a generates a logic high address signal XSEL using the second step-up voltage VPPSA. The latch unit 44b supplies the ground voltage to the main wordline MWL0. Accordingly, the sub decoder 46 supplies the step-down voltage VR to the sub wordline SWL0.

Figure 6:
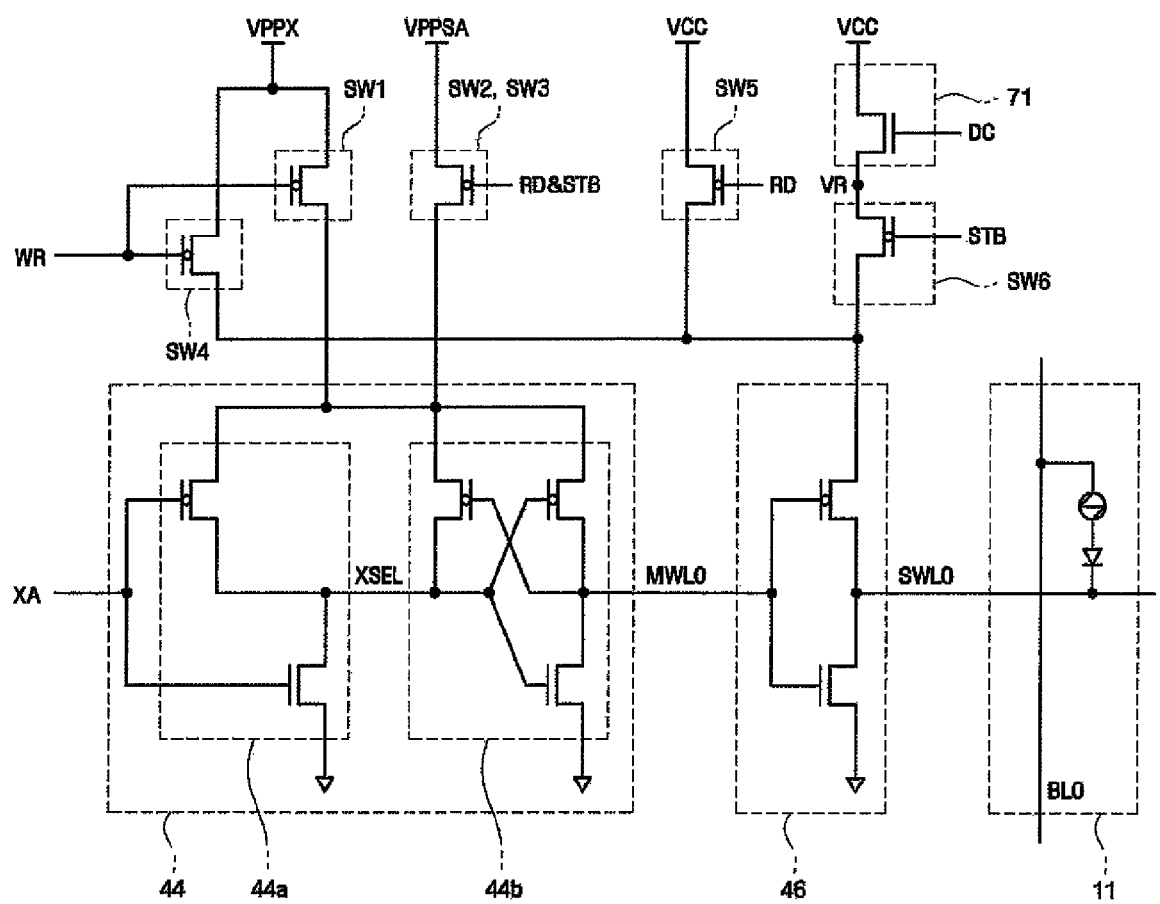
FIG. 6 is a circuit diagram of a nonvolatile memory according to a third embodiment of the present invention.

FIG. 6 is a circuit diagram of a nonvolatile memory according to a third embodiment of the present invention.

Referring to FIG. 6, in the third embodiment of the present invention, a step-down unit 71 is implemented as an NMOS transistor having a gate to which a constant voltage DC is applied. The resistance of the NMOS transistor varies according to the level of the constant voltage DC. Accordingly, the level of the step-down voltage VR changes. The level of the constant voltage DC may be set to an appropriate value using a mode register set (MRS) or a fuse.

Figure 7:
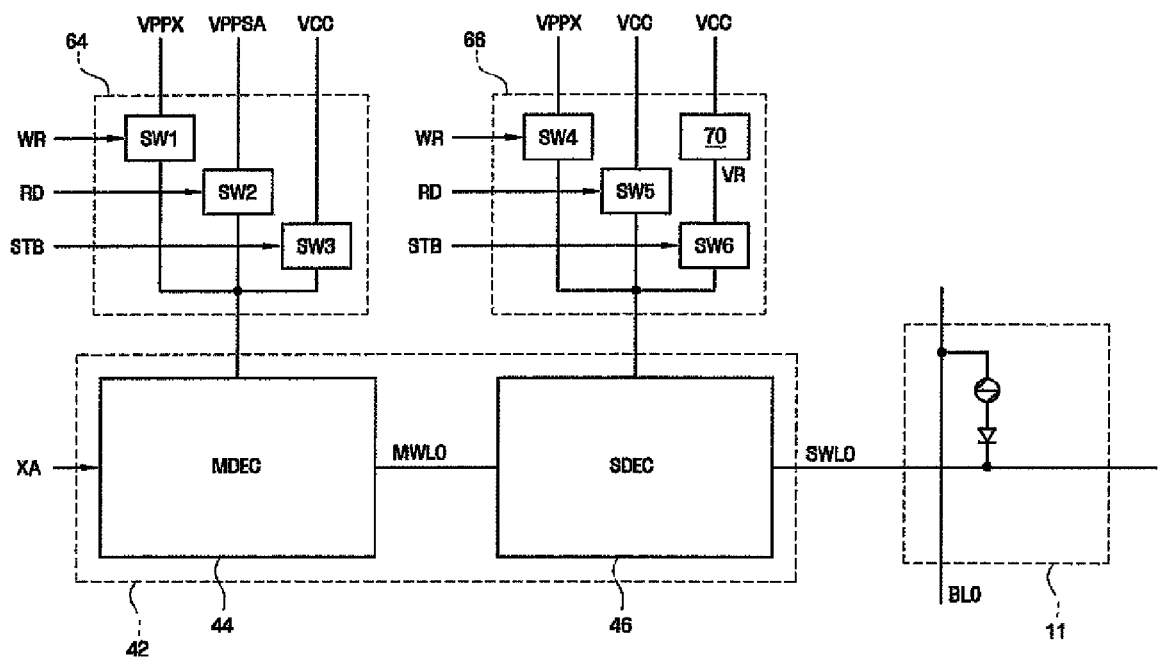
FIG. 7 is a block diagram of a nonvolatile memory according to a fourth embodiment of the present invention.
Figure 8:
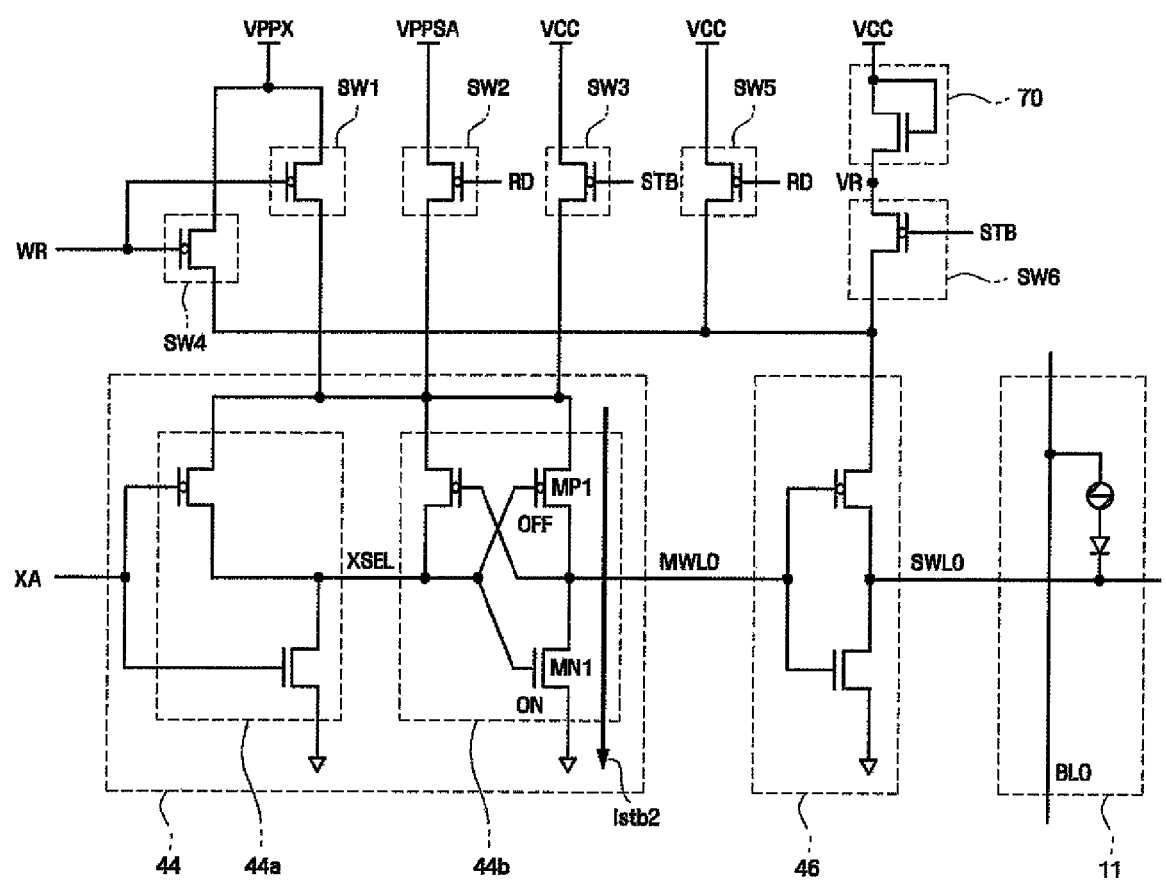
FIG. 8 is a circuit diagram of a nonvolatile memory according to the fourth embodiment of the present invention.

FIGS. 7 and 8 are block and circuit diagrams, respectively, of a nonvolatile memory according to a fourth embodiment of the present invention.

Referring to FIGS. 7 and 8, in the fourth embodiment of the present invention, a first voltage switch 64 supplies a second step-up voltage VPPSA to a main decoder 44 during a read period and supplies a power supply voltage VCC to the main decoder 44 during a standby period. A second switching unit SW2 may be implemented as a PMOS transistor having a gate to which a read signal RD is input, and a third switching unit SW3 may be implemented as a PMOS transistor having a gate to which a standby signal STB is input.

Since the power supply voltage VCC is supplied to the main decoder 44 during the standby period, the consumption of standby current Istb2 can be reduced. Specifically, during the standby period, a PMOS transistor MP1 of a latch unit 44b is turned off, and an NMOS transistor MN1 thereof is turned on. Generally, off current of a PMOS transistor is very large, that is, approximately four to five times the off current of an NMOS transistor. During the standby period, the off current flowing through the turned-off PMOS transistor MP1 is leaked through the turned-on NMOS transistor MN1. In summary, the standby current Istb2 flows through the turned-off PMOS transistor MP1 and the turned-on NMOPS transistor MN1.

In the fourth embodiment of the present invention, the power supply voltage VCC, which is lower than the second step-up voltage VPPSA, is supplied to the main decoder 44 during the standby period in order to reduce the standby current Istb2. Less standby current Istb2 is generated when the second step-up voltage VPPSA is supplied to the main decoder 44 during the standby period (see FIG. 5) than when the power supply voltage VCC is supplied to the main decoder 44 during the standby period (see FIG. 8).

Although not shown in the drawings, in order to further reduce the standby current Istb2, the first voltage switch 64 may supply a step-down voltage VR, instead of the power supply voltage VCC, to the main decoder 44 during the standby period.

Figure 9:
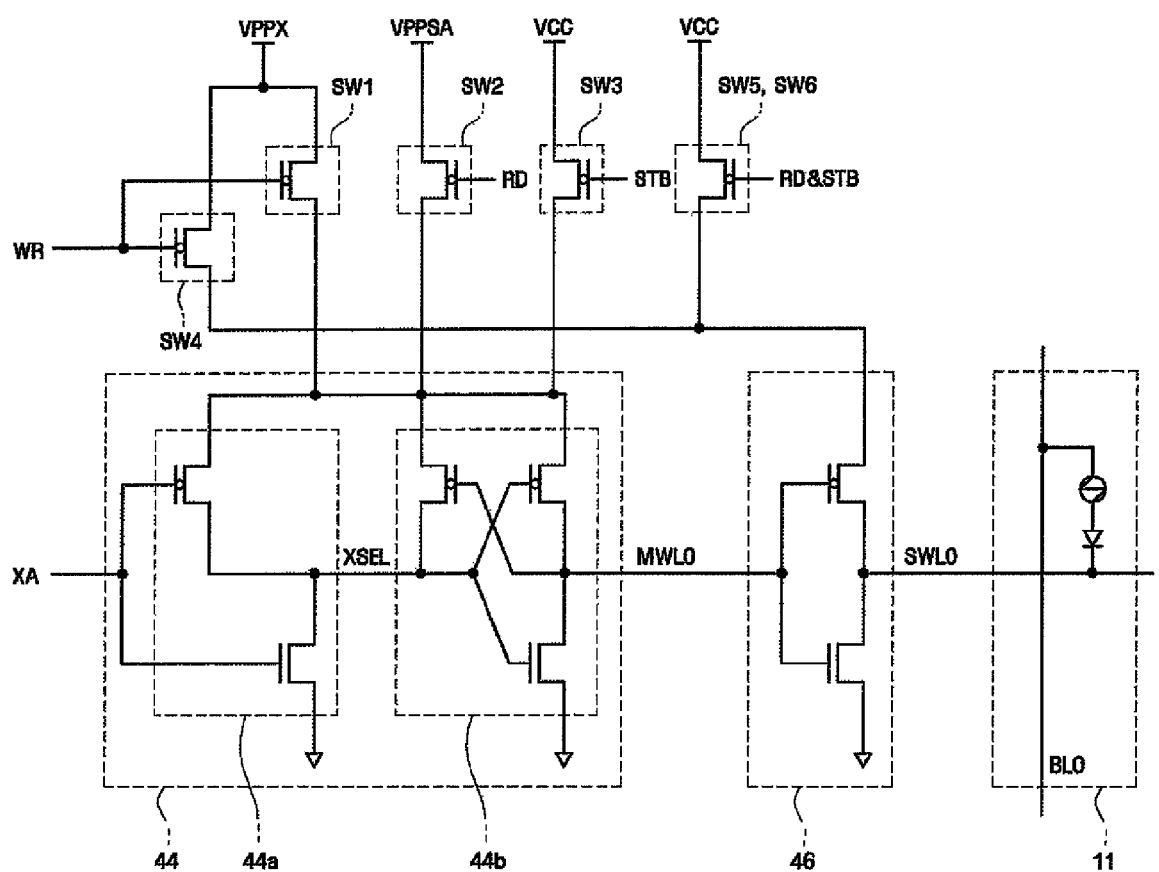
FIG. 9 is a circuit diagram of a nonvolatile memory according to a fifth embodiment of the present invention.

FIG. 9 is a circuit diagram of a nonvolatile memory according to a fifth embodiment of the present invention.

Referring to FIG. 9, the fifth embodiment is different from the fourth embodiment in that a second voltage switch 66 supplies a power supply voltage VCC to a sub decoder 46 during a read period and a standby period. Fifth and sixth switching units SW5 and SW6 may be implemented as a PMOS transistor having a gate to which a signal RD&STB generated using a read signal RD and a standby signal STB is input. The consumption of standby current may be somewhat greater in the fifth embodiment than in the fourth embodiment.

Figure 10:
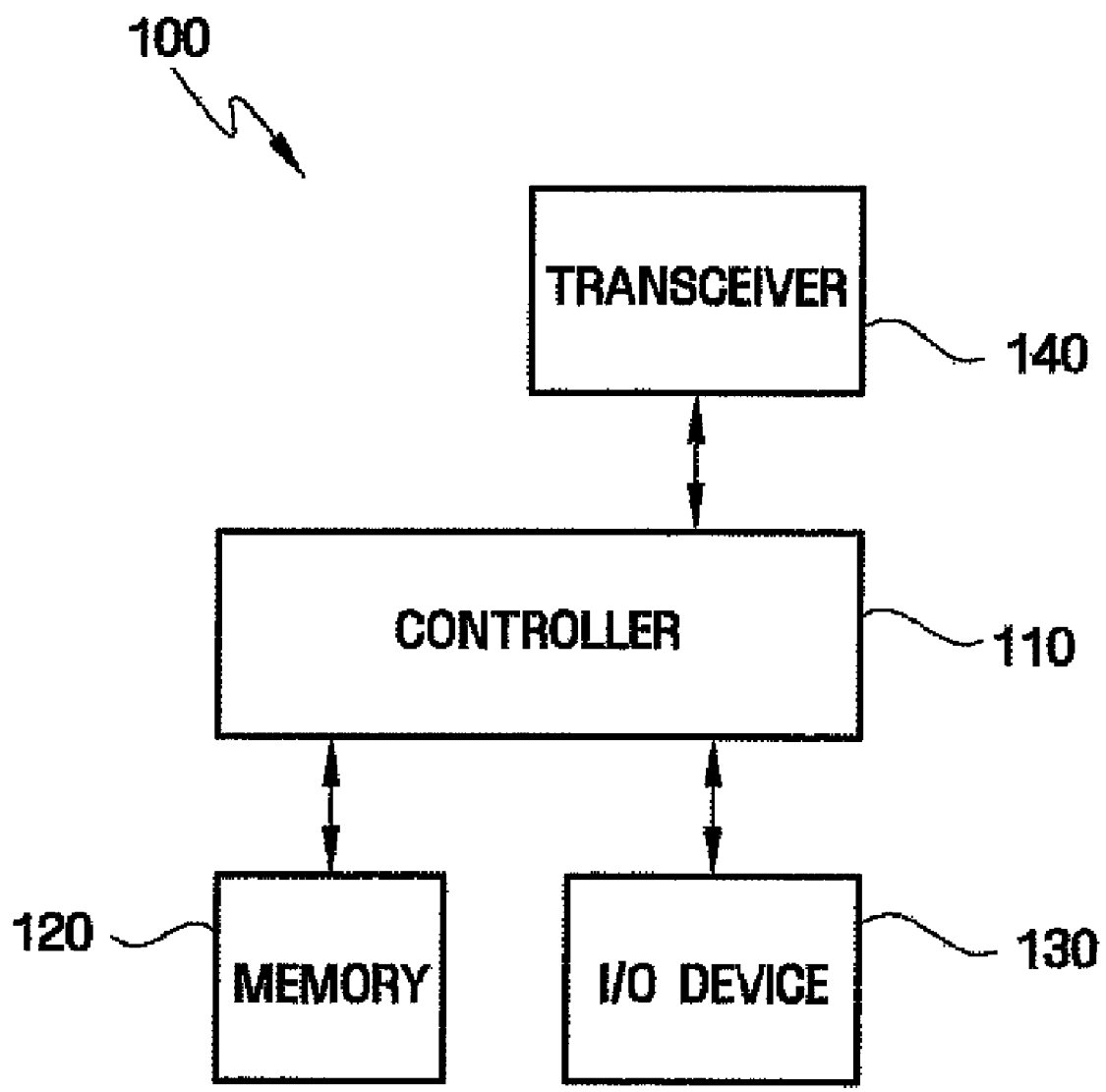
FIG. 10 is a schematic block diagram of a portable media system including a nonvolatile memory according to an exemplary embodiment of the present invention.

FIG. 10 is a schematic block diagram of a portable media system 100 including a nonvolatile memory according to an exemplary embodiment of the present invention. In the present embodiment, a mobile phone is used as the portable media system 100. However, the present invention is not limited thereto. That is, the portable media system 100 may also be a two-way communication system, a one-way pager, a two-way pager, a personal communication system, a portable computer, a personal data assistant (PDA), an MPEG audio layer-3 (MP3) player, a digital camera, or the like.

Referring to FIG. 10, the portable media system 100 includes a controller 110, a memory 120, an input/output (I/O) device 130, and a transceiver 140.

The controller 110 may be, for example, a microprocessor, a digital signal processor, or a micro controller.

The memory 120 is configured to store messages to be transmitted to the portable media system 100 or external destinations. That is, the memory 120 stores commands issued by the controller 110 while the portable media system 100 operates or stores data. The memory 120 includes one or more different types of memories. For example, the memory 120 may use a volatile memory, a flash memory and/or a nonvolatile memory such as a phase-change memory. In this case, the phase-change memory may be a nonvolatile memory according to any of the exemplary embodiments of the invention disclosed above.

One of the challenges of the present invention is to reduce the amount of current consumed by the portable media system 100. To this end, a step-down voltage may be applied to wordlines during a standby period as in the above-described embodiments of the present invention, thereby reducing the consumption of standby current.

The I/O device 130 is manipulated by a user and is configured to generate a message according to the manipulation of a user. The I/O device 130 may include a keypad, a monitor and the like.

The portable media system 100 may wirelessly transmit or receive messages through the transceiver 140 that is connected to an antenna (not shown). The portable media system 100 may transmit or receive messages using a protocol such as code division multiple access (CDMA), global system for mobile communication(GSM), North American digital cellular (NADC), time division multiple access (TDMA), extended TDMA (ETDMA), third-generation wideband CDMA (WCDMA), or CDMA-200.

As described above, a nonvolatile memory according to the present invention can reduce standby current. In addition, the nonvolatile memory can increase its speed when shifting from a standby state to an active state.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A nonvolatile memory comprising:
a memory cell array having a plurality of nonvolatile memory cells arranged in a plurality of rows and a plurality of columns;
a plurality of wordlines comprising a main wordline and a plurality of sub wordlines, each of the plurality of wordlines being coupled to a corresponding one of the plurality of rows;
a plurality of bitlines, each of the plurality of bitlines coupled to a corresponding one of the plurality of columns;
a row decoder comprising a main decoder coupled to the main wordline and a sub decoder coupled between the main wordline and each of the plurality of sub wordlines and being coupled to the plurality of wordlines and configured to supply a step-down voltage to the plurality of wordlines during a standby period, the step-down voltage being lower in magnitude than a power supply voltage; and
a first voltage switch coupled to the sub decoder and comprising a step-down unit configured to receive the power supply voltage and output the step-down voltage, and a first switching unit configured to supply the step-down voltage to the sub decoder in response to a standby signal.

2. The memory of claim 1, wherein the plurality of bitlines are floated during the standby period.

3. The memory of claim 1, wherein the row decoder is configured to supply a step-up voltage to at least one of the plurality of wordlines during a write period, the step-up voltage being higher in magnitude than the power supply voltage.

4. The memory of claim 1, wherein the row decoder is configured to supply the power supply voltage to at least one of the plurality of wordlines during a read period.

5. The memory of claim 1, wherein the step-down unit is a diode-connected transistor.

6. The memory of claim 1, wherein the step-down unit is a transistor having a gate to which a constant voltage is input.

7. The memory of claim 1, further comprising a second voltage switch coupled to the main decoder, wherein the second voltage switch is configured to supply the power supply voltage to the main decoder in response to the standby signal.

8. The memory of claim 1, wherein each of the plurality of nonvolatile memory cells is a diode-controlled phase-change random access memory (PRAM) cell.

9. A nonvolatile memory comprising:
a main wordline coupled to a plurality of sub wordlines;
a main decoder coupled to the main wordline; and
a voltage switch configured to supply a first voltage to the main decoder during a read period and further configured to supply a second voltage to the main decoder during a standby period, the second voltage being lower in magnitude than the first voltage.

10. The memory of claim 9, wherein the first voltage is a step-up voltage that is higher in magnitude than a power supply voltage, the second voltage being one of the power supply voltage and a step-down voltage.

11. The memory of claim 9, wherein the voltage switch is configured to supply a third voltage to the main decoder during a write period, the third voltage being higher in magnitude than the first voltage.

12. The memory of claim 9, wherein the main decoder comprises a latch unit configured to latch an address signal and output a latched address signal to the main wordline, the latch unit further configured to receive on of the first voltage and the second voltage.

13. A nonvolatile memory comprising:
- a plurality of memory blocks, each comprising a plurality of nonvolatile memory cells;
- a main wordline common to the plurality of memory blocks;
- a plurality of sub wordlines, each of the plurality of sub wordlines corresponding to one of the plurality of memory blocks;
- a main decoder coupled to the main wordline;
- a plurality of sub decoders, each of the plurality of sub decoders coupled between the main wordline and a corresponding one of the plurality of sub wordlines;
- a first voltage switch coupled to the main decoder and configured to selectively supply one of at least two voltages to the main decoder, supply a first voltage to the main decoder during a write period, supply a second voltage to the main decoder during a read period, wherein the second voltage is lower in magnitude than the first voltage, and supply a third voltage to the main decoder during a standby period, wherein the third voltage is lower in magnitude than the second voltage; and
- a second voltage switch coupled to the plurality of sub decoders and configured to selectively supply one of at least two voltages to the sub decoders.

14. The memory of claim 13, wherein the first voltage is a first step-up voltage, the second voltage is a second step-up voltage, and the third voltage is one of a power supply voltage and a step-down voltage.

15. The memory of claim 13, wherein the second voltage switch is configured to supply a fourth voltage to the plurality of sub decoders during the write period, the second voltage switch further configured to supply a fifth voltage to the plurality of sub decoders during the read period, the fifth voltage being lower in magnitude than the fourth voltage, the second voltage switch further configured to supply a sixth voltage to the plurality of sub decoders during the standby period, the sixth voltage being lower in magnitude than the fifth voltage.

16. The memory of claim 15, wherein the fourth voltage is a step-up voltage, the fifth voltage is a power supply voltage, and the sixth voltage is a step-down voltage.

* * * * *